Figure 1:
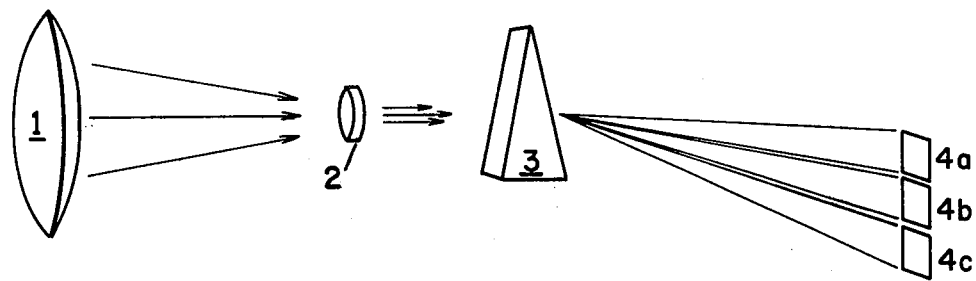

United States Patent [19]

Dettling

[11] 4,021,267
[45] May 3, 1977

[54] HIGH EFFICIENCY CONVERTER OF SOLAR ENERGY TO ELECTRICITY

[75] Inventor: Joseph R. Dettling, Santa Clara, Calif.

[73] Assignee: United Technologies Corporation, Hartford, Conn.

[22] Filed: Sept. 8, 1975

[21] Appl. No.: 611,454

[52] U.S. Cl. .......................................... 136/89 PC
[51] Int. Cl.² ........................................ H01L 31/04
[58] Field of Search ................... 136/89; 250/24 J

[56] References Cited

UNITED STATES PATENTS

| 2,641,712 | 6/1953 | Kircher | 136/89 X |
| 3,912,931 | 10/1975 | Gravisse et al. | 250/458 |

FOREIGN PATENTS OR APPLICATIONS

| 1,089,018 | 9/1960 | Germany | 136/89 |
| 358,214 | 10/1931 | United Kingdom | 136/89 |

OTHER PUBLICATIONS

K. H. Spring, Editor, "Direct Generation of Electricity," Academic Press, N.Y. (1965), p. 354.
W. R. Cherry, "Advanced Photovoltaic Devices," 14th Annual Power Sources Conference (1960), pp. 37–38.
H. A. Strobel, "Chemical Instrumentation: A Systematic Approach," Second Edition, Addison–Wesley, Reading, Mass. (1973), p. 327.
H. H. Willard et al., "Instrumental Methods of Analysis," Fifth Ed., D. Van Nostrand, N.Y. (1974), p. 57.

*Primary Examiner*—John H. Mack
*Assistant Examiner*—Aaron Weisstuch
*Attorney, Agent, or Firm*—Steven F. Stone

[57] ABSTRACT

Apparatus is disclosed which permits the use of a large proportion of the solar spectrum in the coversion of solar energy to electricity by means of photovoltaic cells. The apparatus comprises a collecting element which concentrates the incident radiation, a collimating element which forms the concentrated incident radiation into a beam of parallel photons, a spectral separation element, such as a prism, prism plate or diffraction grating which spectrally separates the solar radiation in the collimated beam and a plurality of photovoltaic cells disposed in the separated spectrum, the energy gap of the cells being matched to the energy of the photons in that portion of the spectrum in which the cells are located.

4 Claims, 2 Drawing Figures

HIGH EFFICIENCY CONVERTER OF SOLAR ENERGY TO ELECTRICITY

BACKGROUND OF THE INVENTION

Typical solar cells for direct conversion of sunlight to electricity have efficiencies in the range of 10–15 percent. This low efficiency, supplemented by high manufacturing costs, has limited their application. Basically, solar panel efficiencies have been limited for the following major reasons:

1. All photovoltaic materials have a particular characteristic energy gap which represents a minimum amount of energy an electron must receive to do useful work. The sun, however, emits a broad spectral distribution of photons, each having an intrinsic energy value given by $E=hf$; where $h$ is Planck's constant and $f$ is the frequency of the photon. Accordingly:
   a. photons which have energies below the energy gap of the photovoltaic material will either be reflected or absorbed and converted to wasted heat which further reduces the efficiency of the solar cell);
   b. photons which have an energy level equal to the energy gap convert nearly all their energy to useful work. (electricity) providing that they are absorbed by the electrons;
   c. photon which have energies greater than the energy gap, convert part of their energy to useful work and their excess energy (above the energy gap) is lost, as wasted heat.
2. A fraction of the incident photons are reflected from the surface of the material.
3. A fraction of the incident photons miss the electrons in the photovoltaic material.
4. A fraction of the incident photons are absorbed at distance greater from the junction than the so-called diffusion length. These photons generated non-useful carriers.
5. There is a significant contact resistance in large solar cell arrays.

Of the above, the first reason constitutes the major source of inefficiency, since the solar spectrum covers a broad range of frequencies with many photons below and above the energy gap of any typical photocell.

In spite of the fact that it has long been known that light can be easily separated into distinct frequency bands as with a prism, the inventor is aware of only one instance in which it has been suggested that the incident radiation be broken into separate energy bands and photovoltaic cells responsive to these energy bands disposed in the path of the appropriate radiation. See "Direct Generation of Electricity," K. H. Spring, Academic Press, 1965, pages 353, 354 and 355 and Proceedings of the 14th Annual Power Source Conference, U.S. Army Signal Research and Development Laboratory, Advanced Photovoltaic Devices, William R. Cherry, pages 37–42, 1960 (cited as footnote 21 in the Spring reference). Instead, most approaches to increase the output of photovoltaic cells have been directed to concentration of the incident radiation. When the incident radiation is concentrated, however, higher temperatures are produced in the photovoltaic cells, the efficiency of the cells is decreased and the need for cooling of the cells becomes necessary. According to this invention, I have developed a high-efficiency converter of solar energy directly to electricity at efficiencies higher than were heretofore available and which permits the use of concentrators without the attendant thermal disadvantages previously noted.

Accordingly, it is an object of this invention to provide a high efficiency converter of solar energy directly to electricity.

It is another object of this invention to provide for the direct conversion of solar energy to electricity in which the photo cells are not exposed to low energy IR radiation.

Figure 2:
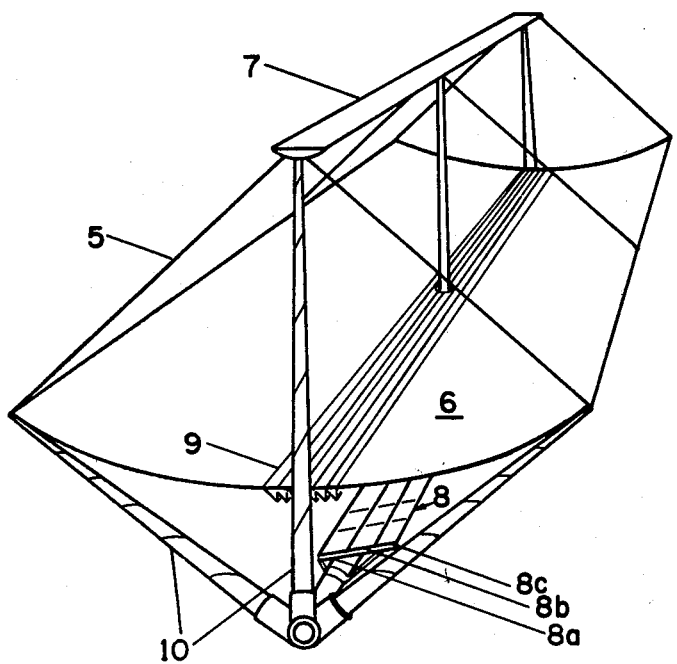

These and other objects of the invention will be readily apparent from the following description with reference to the drawings wherein:

FIG. 1 is a schematic representation of the essential elements of the invention; and, FIG. 2 is a view of one embodiment of this invention.

DESCRIPTION OF THE INVENTION

Referring now to FIG. 1, the apparatus of this invention consists of a concentrator element 1 which may be a lens or any other light concentrating device, such as a cylindrical or parabolic mirror or an array of mirrors. The collimator 2 is a lens or mirror having a configuration, determined by the configuration of the concentration that will cause the convergent or divergent beam from the concentration 1 to be rendered parallel. The beam of paralled light from the collimator 2 is then passed through a suitable spectral separator 3, such as a prism, prism plate or diffraction grating, to separate the light into its various components. Prisms or prism plates are preferred since they operate on a refraction principle where losses are less than in the interface based diffraction gratings. Finally, photovoltaic cells 4 $a$, $b$ and $c$ having the appropriate energy gaps are disposed in the spectrally separated light at a location in the spectral region where the energy of the incident radiation closely approximates the energy gap of the cell. Since, in passing through the spectral separation 3, infra red (IR) radiation is less refracted than the visible and ultraviolet (UV), it is possible by appropriate location of the photovoltaic cells to almost completely reject the low energy IR photons. These IR photons are undesirable since they are not converted to electricity and merely heat the cells and decrease their efficiency. The inventor is unaware of any other system in which it is possible to reject the low energy IR portion of the spectrum without undesirable heating of some part of the apparatus. It is also possible to utilize certain of the higher energy UV radiation which may be difficult to match to a photovoltaic material by coating a lower energy photovoltaic material with thin layers of fluorescent material which will produce, upon exposure to UV, light responsive to the energy gap of the cell.

From a consideration of the geometry of the simple system described in FIG. 1, it becomes readily apparent why an efficient, high-energy system requires both a concentrator 1 and a collimator 2 in conjunction with the spectral separator 3. If, for example, it were attempted to employ the system without a concentrator as is suggested in the Spring publication, the total area of the photovoltaic cells must necessarily be greater than the area of the spectral separator which receives in incident radiation. Thus, although spectral separation is obtained permitting the advantages associated with matching the energy gap of the photovoltaic cell to the energy of the incident radiation, the intensity of the radiation to each cell is substantially lowered and the required total area of the photovoltaic cells becomes uneconomically large. If an attempt is made to use the system with a concentrator without some form of collimation, the spectral separator will not efficiently separate all the light since the incident radiation to the spectral separator does not consist of paralled beams. As a result, a substantial portion of the light passing through the separator will still be "white." Thus, while in the inventor's system it is still necessary that the area of the photovoltaic cells be greater than the area of the spectral separator upon which the incident radiation impinges, the use of concentrator and collimating elements permits much higher intensity radiation to be passed to the photovoltaic cells through the spectral separator. The ability to reject the low energy IR photons substantially overcomes the heat problems associated with the use of a concentrator.

In the schematic arrangement set forth above, it is suggested, for example, that the low energy IR ($<0.6$ ev) be rejected, the near IR ($0.6$ev $- 1.1$ ev) be converted in a germanium photovoltaic cell 4a having a threshold of 0.6 ev, the near IR and visible portion of the spectrum ($1.1$ ev $- 2.4$ ev) be converted in a silicon photovoltaic cell 4b having a threshold of 1.1 ev, a gallium arsenide cell having a threshold of 1.4 ev or a CdS-CuS cell having a threshold of 1.2 ev. The higher energy portion of the spectrum ($>2.4$ ev.) could be converted by a CdS cell 4c having a threshold of 2.4 ev, or a gallium phosphide, all having a threshold of 2.26 ev. It is also apparent that other different materials can be used and that as more photovoltaic materials become commercially available, it may be possible to more precisely and efficiently utilize various portions of the spectrum by using a larger number of different photovoltaic cells. While the general schematic arrangement of the system has been set forth above with respect to FIG. 1 in an attempt to generally define the necessary elements of the system, FIG. 2 represents a preferred embodiment of the invention for use in any practical system where a low-cost, light-weight device is required. Certain characteristics of this particular embodiment make it particularly useful as a power source for a space vehicle, for example.

Referring now to FIG. 2, the converter of this invention consists of a tubular framework 10 and support guys 5 connecting a concentrating mirror 6 to a collimating mirror 7. Mirror 6 has disposed therein a prism plate 9 which is located in the path of the beam reflected from the collimating mirror 7 and behind the beam is an array of photovoltaic cells 8; Cell 8a being a germanium cell; Cell 8b being a silicon cell; and, Cell 8c being a gallium phosphide cell. While such a structure need not be made collapsible for many conventional applications, if a space vehicle application is desired, the tubular supporting structure can be telescoping fabricated, for example, from Stacer springs, and the major reflecting mirror 6 can be a metalized plastic film. When the device is deployed in space, the mirror 6 can be inflated to maintain itself in the proper configuration. Alternately, a simple film disposed between the frame will maintain a parabolic shape on exposure to the solar radiation pressure. A cylindrical shape could be similarly maintained by elastostatic repulsion, if like electrostatic charges are maintained on the concentrating mirror 6 and collimating mirror 7.

This invention has been described with respect to certain embodiments thereof; however, it is obvious that many modifications thereof can be made by workers skilled-in-the-art without departing from the scope of this invention, which is limited only by the following claims.

I claim:
1. A high-efficiency converter of solar energy directly to electricity which comprises in combination:
   a. concentrator means for concentrating the incident solar energy impinging thereon;
   b. collimator means disposed in the path of radiation from said concentrator means for producing a beam of photons traveling in substantially parallel paths;
   c. means for forming a spectrally separated beam of non-parallel photons from said beam fo substantially parallel photons, said means being disposed in the path of said substantially parallel photons; and
   d. photovoltaic means for converting the solar energy in said spectrally separated beam of light directly into electricity, said means being disposed in the path of light coming from said spectral separating means but outside of the path of the low energy IR portion of the solar spectrum produced by said spectral separating means.

2. The converter of claim 1 wherein said means for forming a spectrally separated beam on non-parallel photons comprises means for refracting the incident radiation.

3. The converter of claim 2 wherein said means for converting the solar energy into electricity comprises a plurality of photovoltaic cells having different energy gaps, said cells being disposed in said spectrally separated beam of light with the energy gaps of each said cell being substantially matched to the energy of the portion of the solar in which it is disposed.

4. The converter of claim 1 wherein said means for converting the solar energy into electricity comprises a plurality of photovoltaic cells having different energy gaps, said cells being disposed in said spectrally separated beam of light with the energy gaps of each said cell being substantially matched to the energy of the portion of the solar spectrum in which it is disposed.

* * * * *